United States Patent [19]
Kato et al.

[11] Patent Number: 4,742,310
[45] Date of Patent: May 3, 1988

[54] AUTOMATIC SOUND VOLUME CONTROLLING DEVICE FOR USE IN AUTOMOTIVE VEHICLE

[75] Inventors: Masayuki Kato; Makoto Odaka; Yoshio Sasaki, all of Saitama, Japan

[73] Assignee: Pioneer Electronic Corporation, Tokyo, Japan

[21] Appl. No.: 886,295

[22] Filed: Jul. 16, 1986

[30] Foreign Application Priority Data

Jul. 16, 1985 [JP] Japan .......................... 60-107564[U]

[51] Int. Cl.⁴ ............................................. H03G 3/30
[52] U.S. Cl. .................................. 330/281; 330/284
[58] Field of Search ....................... 330/278, 281, 284

[56] References Cited

U.S. PATENT DOCUMENTS 4,134,079  1/1979  Kohtani ............................... 330/281

FOREIGN PATENT DOCUMENTS 0140011  8/1982  Japan ................................... 330/281
2074408  10/1981  United Kingdom ................ 330/281

Primary Examiner—Gene Wan
Attorney, Agent, or Firm—Sughrue, Mion, Zinn, Macpeak, and Seas

[57] ABSTRACT

An automatic sound volume device which adjusts the volume of an audio signal in a vehicle to compensate for vehicle noise. A time constant circuit smooths the level output of a microphone to smooth the volume variations. However, the time constant is long for increases in noise but short for decreases in noise.

6 Claims, 3 Drawing Sheets

AUTOMATIC SOUND VOLUME CONTROLLING DEVICE FOR USE IN AUTOMOTIVE VEHICLE

BACKGROUND OF THE INVENTION

1. Field of the Invention

The present invention relates generally to an automatic sound volume controlling device for use in automotive vehicles in which sound volume is automatically controlled depending upon running-noises of the vehicle detected within the vehicle. More particularly, the invention relates to an improvement of a time constant circuit employed in such a device serving to delay the change of sound volume when the level of the detected running-noise changes abruptly.

2. Background Art

A prior art device is shown in FIGS. 2 and 3. In FIG. 2, a microphone 1 is disposed in a relevant position inside the vehicle. An amplifier 2 amplifies sound picked up by the microphone 1. A low-pass filter 3 allows to pass only low frequency components contained in the output of the amplifier 2. A detection circuit 4 detects noise components from the output of the low-pass filter 3. A rectifying circuit 5 rectifies the detection output supplied from the detection circuit 4. A logarithmic compression circuit 6 subjects the rectified d.c. output from the rectifying circuit 5 to logarithmic compression. A time constant circuit 7 imparts a long time constant upon the output of the logarithmic compression circuit 6 sufficient to extend its output. The output of the time constant circuit 7 is supplied to an electronic volume control 8, including, for instance, an A/D converter, etc. to thereby control the sound volume. The electronic volume control 8 controls the amplification of an audio signal which is then projected from a loudspeaker 9 with the desired sound volume.

Shown in FIG. 3 is a circuit diagram illustrating the time constant circuit 7, which is comprised of an operational amplifier 7a, a time constant sub-circuit including a resistor $R_1$ and a capacitor $C_1$, and a feed-back resistor $R_2$.

In operation, the sound picked up by the microphone 1 is amplified by the amplifier 2 and only the running-noise of the vehicle is allowed to pass by the low-pass filter 3. Then, the running-noise is detected by the detection circuit 4 and is rectified by the rectifying circuit 5 to provide a d.c. signal. The d.c. signal outputted from the rectifying circuit 5 is applied to the logarithmic compression circuit 6, from which obtained is a logarithmically changing d.c. signal. The thus obtained d.c. signal is introduced into the time constant circuit 7 in which the time constant has been predetermined so that the output therefrom is not abruptly varied, that is, the output is made to vary smoothly when the level of the noise increases or decreases.

Between the output terminal of the operational amplifier 7a and its inverting input terminal, the capacitor $C_1$ is connected to thereby shift a frequency response curve of the operational amplifier 7a to a lower frequency side so as to lower the level of the frequency response curve. As a result, the level of the sound volume is smoothly changed when the vehicle's speed changes. In FIG. 4, the change of the vehicle's speed is indicated by a solid line and the change of the level of the sound volume is indicated by a dotted line.

As is apparent from FIG. 4, when the running vehicle is decelerating and is finally stopped, the sound volume is still maintained at a large value despite the fact that the running-noise has decreased. This is caused by the large time constant of the time constant circuit 7. The duration when such a phenomenon occurs is indicated by character B in FIG. 4. Accordingly, the prior art device suffers from a drawback such that the large sound volume is maintained for a certain period of time thereby causing the listeners to feel distracted.

SUMMARY OF THE INVENTION

The present invention has been made in order to resolve the above drawback. According to the present invention, an improved sound volume controlling device is provided which does not cause the listeners to feel uncomfortable, with a provision of a feature that the sound volume is lowered corresponding to the speed reduction of the vehicle.

In order to achieve the foregoing object, when the charging or discharging voltage of the capacitor of the time constant circuit is lower than the voltage of input signal, the capacitor is charged in proportion to the level of the input signal whereas when the charging or discharging voltage of the capacitor is larger than the voltage of the input signal, the capacitor is caused to be discharged depending upon the time constant.

DESCRIPTION OF THE PREFERRED EMBODIMENTS

A preferred embodiment of the present invention will be described with reference to FIG. 1. Since the arrangement of the automatic sound volume controlling device is the mostly the same as that of the prior art device except for the arrangement of the time constant circuit 7 shown in FIG. 2, the following description will be focused only on the time constant circuit 7.

Figure 5:
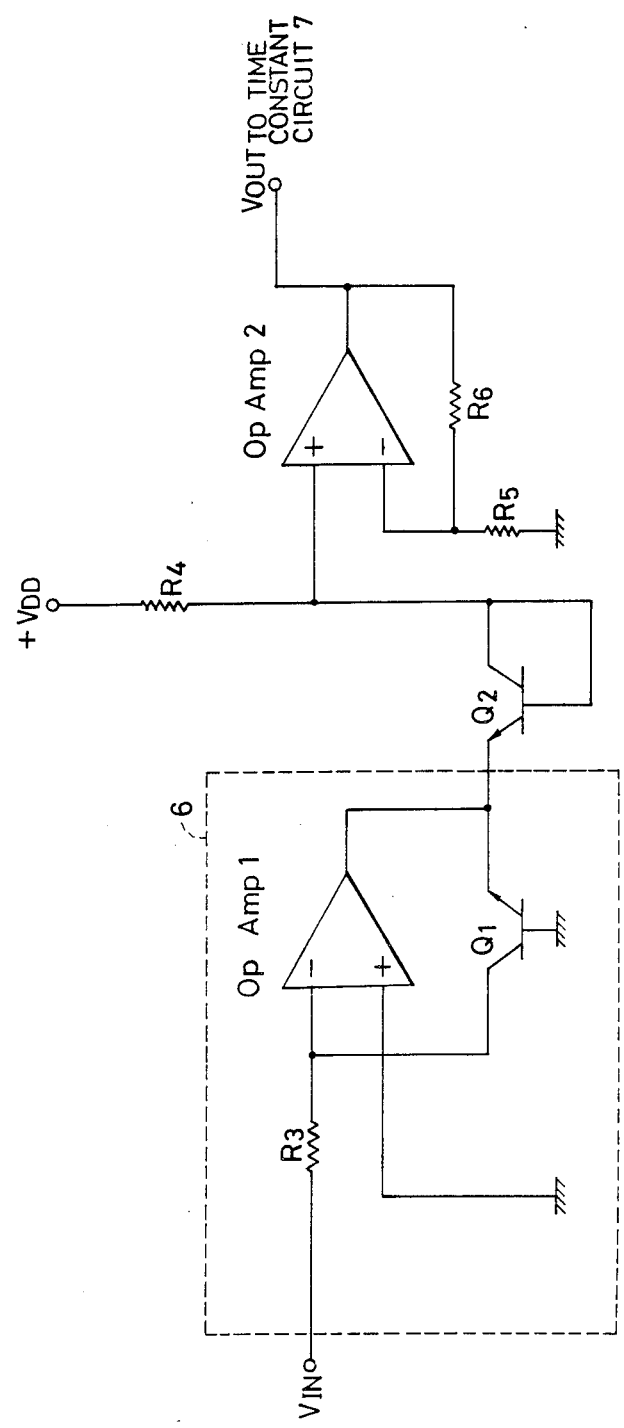
FIG. 5 is a detailed circuit diagram of a logarithmic compression circuit.

However, the operation of the logarithmic compression circuit 6 will be explained in some detail in order to explain the operation of the preferred embodiment of the time constant circuit 7. In FIG. 5 is shown the detailed schematic of the logarithmic compression circuit 6. Also shown are a temperature compensation circuit consisting of a transistor $Q_2$ and a resistor $R_4$ and an output buffer consisting of an operational amplifier OP-AMP-2 and resistors $R_5$ and $R_6$. Neither the temperature compensation nor buffer is crucial to the invention and will not be further discussed.

In the operation of the logarithmic compression circuit 6, when the input signal $V_{in}$ is applied, a current equal to $V_{in}/R_3$ flows through a resistor $R_3$. That is, the current flows in proportion to the level of the input voltage $V_{in}$. Note that the inverting and non-inverting terminals of the operational amplifier OP-AMP-1 have been maintained at approximately equal potential prior to inputting of the input signal. The current flowing in the resistor $R_3$ flows into the collector of a transistor $Q_1$. Since the base of the transistor $Q_1$ is connected to a reference point, the output voltage of the operational amplifier OP-AMP-1 and the emitter voltage of the transistor $Q_1$ is lowered by the base-emitter voltage $V_{BE}$ of the transistor $Q_1$ with respect to the input voltage. As is well known in the art, the collector current $I_c$ and the base-emitter voltage $V_{BE}$ have a logarithmic relation. The current $V_{in}/R_3$ flowing into the collector of the transistor $Q_1$ is proportional to the level of the input signal. Hence the output of the operational amplifier OP-AMP-1 becomes a negative logarithmic value with respect to the input current $V_{in}/R_3$.

The relation between the input current $V_{in}/R_3$ and the output voltage $V_O$ are as follows:

$$V_O = -kT/q(\ln(V_{in}R_3) - \ln(I_e))$$

where k is Boltzmann's constant, q is the electric charge of an electron, T is an absolute temperature, and $I_e$ is the emitter saturation current of the transistor $Q_1$. As is apparent from the above equation, when $V_{in}$ increases, the output voltage increases in the negative direction, i.e. the output of the logarithmic amplifier decreases as the noise level increases.

Figure 1:
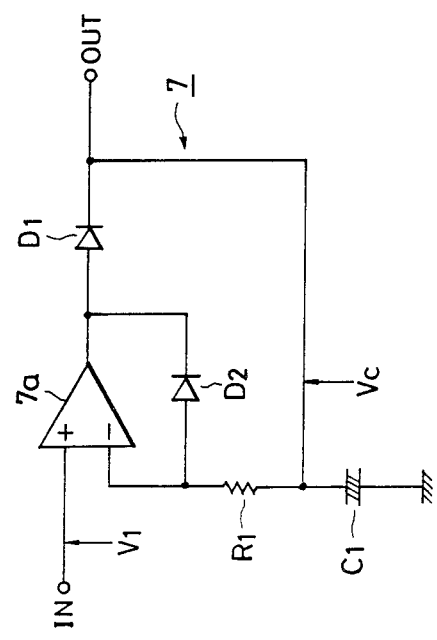
FIG. 1 is a circuit diagram of a time constant circuit incorporated in an automatic sound volume controlling device for use in an automotive vehicle according to the present invention.
Figure 2:
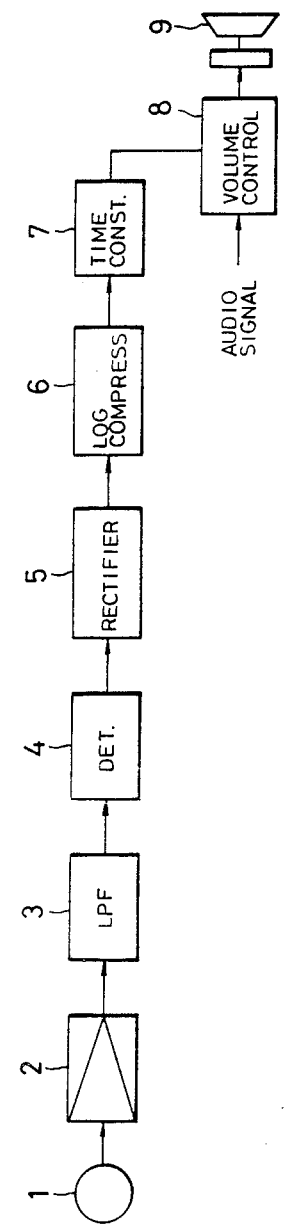
FIG. 2 is a block diagram showing a device of the present invention.
Figure 3:
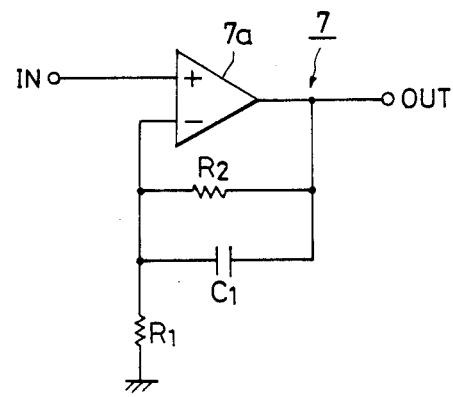
FIG. 3 is a circuit diagram of a prior art time constant circuit.

In FIG. 1, an input terminal IN receives from the logarithmic compression circuit 6 a d.c. signal which changes logarithmically depending upon the level of the running-noise. From an output terminal OUT, a d.c. signal is outputted for which the level of the d.c. signal changes according to a different time constant when the d.c. signal inputted to the terminal IN rises than the time constant when the inputted d.c. signal decreases. The terminal OUT is connected to an electronic volume control, A/D converter etc. (not shown). Between the output of the operational amplifier 7a and an inverting input terminal of the operational amplifier 7a, diodes $D_1$ and $D_2$ are connected. A junction point between a resistor $R_1$ and a capacitor $C_1$, together constituting a time constant sub-circuit, is connected to the output terminal OUT.

In operation, when the vehicle is not moving and the noise is extremely small, the input voltage the input terminal IN is set by the gain of the preceding stages to be a mid-point voltage of a power source voltage of the operational amplifier 7a. It should be noted that a single battery is used in vehicles, so that the mid-point voltage is half of the power source voltage $V_{cc}$. As a result, the voltage $V_c$ impressed across the capacitor $C_1$ by the operational amplifier 7a is approximately equal to $\frac{1}{2} \cdot V_{cc}$.

When the level of the running-noise increases, the voltage at the input terminal IN is lowered as the running-noise increases. Therefore, the output voltage of the operational amplifier 7a is also lowered by a blocking voltage $V_f$ across the diode $D_2$ with reference to the voltage at the input terminal. Since the old value of $V_c$ is higher than the new value of $V_1$, as amplified by the operational amplifier 7a, discharge of the capacitor $C_1$ through the diode $D_1$ is blocked because it is now reverse biased. Instead, the capacitor $C_1$ is discharged through resistor $R_1$ and the forward biased diode $D_2$.

Assuming that the voltage at the input terminal IN is $V_1$ and the voltage across the capacitor $C_1$ is $V_c$, the voltage on the inverting input terminal of the operational amplifier 7a is $V_1$. Thus the current flowing through the resistor $R_1$ becomes $(V_c - V_1)/R_1$ which is the discharge current of the capacitor $C_1$. Setting the time constant of the resistor $R_1$ and the capacitor $C_1$ at a large value, the lowering speed of the voltage across the capacitor $C_1$ is delayed. Therefore, even if the running-noise abruptly rises, the voltage at the output terminal OUT is smoothly lowered.

The foregoing description has been directed to the case that when the noise increases the output voltage is lowered. Conversely, in order to allow for the situation where the output voltage increases when the running-noise increases, the anodes and the cathodes of the respective diodes $D_1$ and $D_2$ may be reversely connected.

Figure 4:
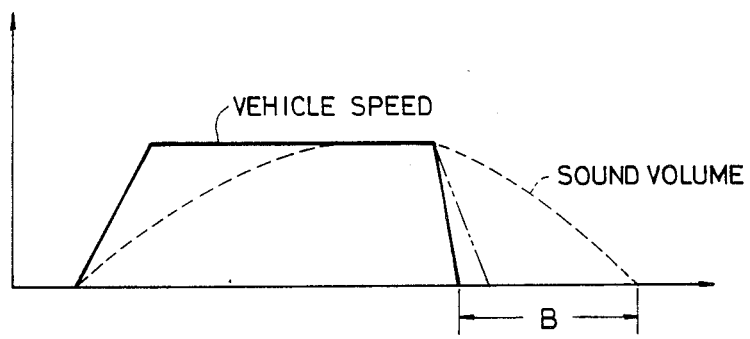
FIG. 4 indicates characteristic curves of time versus vehicle speed and sound volume.

Next, in a condition that the running-noise is quite large and the voltage $V_c$ across the capacitor $C_1$ is very low, if the vehicle's speed is abruptly reduced and is then stopped so that the noise has become negligible, the terminal voltage at the input terminal IN rises to around $\frac{1}{2} \cdot V_{cc}$. However, since the voltage at the inverting terminal of the operational amplifier 7a is at the very low voltage $V_c$, the output terminal of the operational amplifier 7a causes the capacitor $C_1$ to abruptly charge through the now forward-biased diode $D_1$ so that the output of the operational amplifier 7a quickly becomes $V_{cc}$. That is, in this case, the voltage at the output terminal OUT substantially changes corresponding to the level of the running-noise. Accordingly, the sound volume becomes small at substantially the same time as when the vehicle stops (as illustrated by the two-dot-and-dash line in FIG. 4), whereby listeners are not distracted.

As described, according to the present invention, since the output voltage is smoothly varied according to the increase of the level of the running-noise and further since the output voltage is changed corresponding to the lowering of the level of the running-noise, the sound volume is changed according to the level of the running-noise, thus providing a natural feeling to the listeners.

What is claimed is:

1. An automatic sound volume controlling device for use in a vehicle comprising:
   microphone means for detecting a level of ambient noise in a vehicle and converting said running noise level to an electrical signal;
   a time constant circuit for smoothing said electrical signal according to a time constant dependent on a direction of change of said electrical signal, whereby said time constant is longer when said ambient noise level has increased that when said ambient noise level has decreased.

2. An automatic sound volume controlling device as recited in claim 1, further comprising means for controlling a volume of an audio signal in accordance with said smoothed electrical signal.

3. An automatic sound volume controlling device as recited in claim 1, wherein said time constant circuit comprises a diode, a resistor, a capacitor, and means for steering a charge flow relative to said capacitor through said resistor when said ambient noise level has increased and for steering said charge flow through said diode when said ambient noise level has decreased.

4. An automatic sound volume control device as recited in claim 3, wherein said microphone means causes said electrical signal to decrease when said ambient noise level increases.

5. An automatic sound volume control device as recited in claim 2, wherein said time constant circuit comprises:

an operational amplifier receiving said electrical signal on a non-inverting input;

a resistor connected on one terminal to an inverting input of said operational amplifier;

a capacitor connected between a fixed potential and a second terminal of said resistor;

a first diode connected between an output of said operational amplifier and an output terminal of said time constant circuit, said output terminal providing said smoothed electrical signal; and a second diode connected between said output of said operational amplifier and said inverting input of said operational amplifier, wherein a first one of said first and second diodes has an anode connected to said output of said operational amplifier and a second one of said first and second diodes has a cathode connected to said output of said operational amplifier.

6. An automatic sound volume control device as recited in claim 5, wherein said microphone means causes said electrical signal to decrease when said ambient noise level increases and wherein said first diode has a cathode and said second diode has an anode both connected to said output of said operational amplifier.

* * * * *